(12) United States Patent
Ausschnitt et al.

(10) Patent No.: US 6,638,671 B2
(45) Date of Patent: Oct. 28, 2003

(54) COMBINED LAYER-TO-LAYER AND WITHIN-LAYER OVERLAY CONTROL SYSTEM

(75) Inventors: Christopher P. Ausschnitt, Lexington, MA (US); William A. Muth, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 88 days.

(21) Appl. No.: 09/977,792

(22) Filed: Oct. 15, 2001

(65) Prior Publication Data

US 2003/0077527 A1 Apr. 24, 2003

(51) Int. Cl.$^7$ ............................. G03F 9/00; G01B 11/00
(52) U.S. Cl. ........................ 430/22; 430/30; 257/797; 356/401; 438/975
(58) Field of Search ..................... 430/22, 30; 356/401; 438/975; 257/797

(56) References Cited

U.S. PATENT DOCUMENTS

| | | | |
|---|---|---|---|
| 4,568,189 A | 2/1986 | Bass et al. | 356/401 |
| 4,848,911 A | 7/1989 | Uchida et al. | 356/356 |
| 5,343,292 A | 8/1994 | Brueck et al. | 356/363 |
| 5,545,593 A | 8/1996 | Watkins et al. | 437/225 |
| 5,629,772 A | 5/1997 | Ausschnitt | 356/372 |
| 5,712,707 A | 1/1998 | Ausschnitt et al. | 356/401 |
| 5,731,877 A | 3/1998 | Ausschnitt | 356/375 |
| 5,756,242 A | 5/1998 | Koizumi et al. | 430/30 |
| 5,757,507 A | 5/1998 | Ausschnitt et al. | 356/401 |
| 5,776,645 A | 7/1998 | Barr et al. | 430/22 |
| 5,790,254 A | 8/1998 | Ausschnitt | 356/372 |
| 5,805,290 A | 9/1998 | Ausschnitt et al. | 356/401 |
| 5,877,861 A | 3/1999 | Ausschnitt et al. | 356/401 |
| 5,914,784 A | 6/1999 | Ausschnitt et al. | 356/375 |
| 5,928,822 A | 7/1999 | Rhyu | 430/30 |
| 5,949,547 A | 9/1999 | Tseng et al. | 356/375 |
| 5,952,134 A | 9/1999 | Hwang | 430/22 |
| 5,953,128 A | 9/1999 | Ausschnitt et al. | 356/399 |
| 5,965,309 A | 10/1999 | Ausschnitt et al. | 430/30 |
| 5,968,693 A | 10/1999 | Adams | 430/30 |
| 5,976,740 A | 11/1999 | Ausschnitt et al. | 430/30 |
| 5,981,119 A | 11/1999 | Adams | 430/30 |
| 5,985,495 A | 11/1999 | Okumura et al. | 430/22 |
| 6,003,223 A | 12/1999 | Hagen et al. | 29/603.12 |
| 6,004,706 A | 12/1999 | Ausschnitt et al. | 430/30 |
| 6,020,966 A | 2/2000 | Ausschnitt et al. | 356/369 |
| 6,027,842 A | 2/2000 | Ausschnitt et al. | 430/30 |
| 6,042,976 A | 3/2000 | Chiang et al. | 430/22 |
| 6,128,089 A | 10/2000 | Ausschnitt et al. | 356/401 |
| 6,130,750 A | 10/2000 | Ausschnitt et al. | 356/401 |
| 6,137,578 A | 10/2000 | Ausschnitt | 356/399 |
| 6,183,919 B1 | 2/2001 | Ausschnitt et al. | 430/30 |
| 6,317,211 B1 | 11/2001 | Ausschnitt et al. | 356/401 |
| 6,346,979 B1 | 2/2002 | Ausschnitt et al. | 355/53 |

FOREIGN PATENT DOCUMENTS

| | | | |
|---|---|---|---|
| JP | 61-168227 A | 7/1986 | |
| JP | 61-170032 A | 7/1986 | |
| JP | 2-260441 A | 10/1990 | |
| JP | 10-213895 A | 8/1998 | |

OTHER PUBLICATIONS

Starikov, Alexander; *"Exposure Monitor Structure"*, SPIE vol. 1261, Integrated Circuit Metrology, Inspection and Process Control IV, 1990, pp. 315–324.

*"Method for Measuring Semiconductor Lithographic Tool Focus and Exposure"*, IBM Technical Disclosure Bulletin, Jul. 1987, pp. 516–518.

Primary Examiner—Christopher G. Young
(74) Attorney, Agent, or Firm—DeLio & Peterson LLC; Peter W. Peterson

(57) ABSTRACT

A system and method of determining alignment error between lithographically produced integrated circuit fields on the same and different lithographic levels comprises creating a first and second level field layers each having a plurality of integrated circuit fields and associated set of metrology structures adjacent and outside each integrated circuit field. In each level, a metrology structure associated with one integrated circuit field is located to nest with another metrology structure associated with an adjacent circuit field when both are properly aligned on the same lithographic level. Overlay metrology structures are provided on one level to nest with metrology structures of another level when the integrated circuit fields are properly aligned on different lithographic levels.

20 Claims, 5 Drawing Sheets

COMBINED LAYER-TO-LAYER AND WITHIN-LAYER OVERLAY CONTROL SYSTEM

BACKGROUND OF THE INVENTION

1. Field of the Invention

The present invention relates to the manufacture of integrated circuits and, in particular, to a method and system for determining alignment error of integrated circuit fields within and between circuit layers made by a lithographic process.

2. Description of Related Art

New metrology measurement and lithography control methodologies for overlay control of integrated circuit fields within and between circuit layers made by a lithographic process are described in U.S. Pat. No. 5,877,861. As described therein, exposure tools known as steppers print multiple integrated circuit patterns or fields (also known as product cells) by lithographic methods on successive layers of a semiconductor wafer. These steppers typically pattern different layers by applying step and repeat lithographic exposure or step and scan lithographic exposure in which the full area of the wafer is patterned by sequential exposure of the stepper fields containing one or more integrated circuits. The stepper achieves registration among pattern layers by aligning the current layer to a previously patterned layer. Overlay control methodologies employ metrology structures located in the field kerf outside the integrated circuit fields or product cells to determine alignment and overlay error of the integrated circuit fields within each circuit layer, and between circuit layers made by a lithographic process. The field kerf is the area which separates the individual cells or patterns. To maximize wafer utilization for circuit manufacturing it is desirable to confine the kerf to the width needed to cut apart the cells or patterns upon completion of the printing to produce the individual product chips. Consequently, an objective of overlay control systems is to minimize the size and number of structures required to determine alignment and overlay error. Determination of layer-to-layer overlay error requires a set of metrology structures that interlock between layers. Determination of within-layer overlay error requires a set of metrology structures that interlock between neighboring fields. Combining layer-to-layer and within-layer control implies a doubling of the required overlay metrology structures. The larger amounts of kerf space required to print the added structures, results in less room for product cells, and subsequently product chips, on the wafer. This is shown by way of example in FIG. 13 of the '861 patent, which shows the numerous different box-in-box structures that are required for intra- and inter-layer alignment and overlay error measurement. It is also noteworthy that the spatial separation of the intra- and inter-layer structures shown in FIG. 13 of the '861 patent introduces noise to the estimation of overlay correction due to the variation of aberrations over the exposure field. Although the problem of meeting present and future overlay tolerance is an industry-wide issue, the solution to metrology structure space/layout issues, which are raised in implementing the '861 patent, has not been addressed within the industry.

Bearing in mind the problems and deficiencies of the prior art, it is therefore an object of the present invention to provide an improved system and method of determining overlay error in integrated circuit fields produced by a lithographic process.

A further object of the invention is to provide a system and method for determining overlay error within a single lithographically produced layer and between different lithographically produced layers of an integrated circuit chip.

It another object of the present invention to provide such a system and method for determining overlay error that does not reduce the amount of active circuit area on a semiconductor wafer.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a system of determining alignment error between lithographically produced integrated circuit fields on the same and different lithographic levels. The method comprises creating a first level field layer having a plurality of first level integrated circuit fields and associated set of first level metrology structures adjacent and outside each integrated circuit field. The first level metrology structures include separate first and second structures. A second structure associated with one first level integrated circuit field is located to nest with a first structure associated with an adjacent, first level integrated circuit field when the both first level integrated circuit fields are properly aligned on the same lithographic level. The first level metrology structures further include overlay metrology structures to determine overlay error between the first level field layer and a field layer on another level. The method also includes creating a second level field layer having a plurality of second level integrated circuit fields and associated set of second level metrology structures adjacent and outside each integrated circuit field. The second level metrology structures include separate third and fourth structures. A fourth structure associated with one second level integrated circuit field is located to nest with a third structure associated with an adjacent, second level integrated circuit field when the both second level integrated circuit fields are properly aligned on the same lithographic level. A second level metrology structure of one second level integrated circuit field is located to nest with an overlay metrology structure of the first level integrated circuit field when the first and second level integrated circuit fields are properly aligned on different lithographic levels.

The related method of the present invention comprises determining the locations of common points of reference on the associated first level metrology structures and on the associated second level metrology structures; measuring alignment error of first level integrated circuit fields from the reference point locations of associated first level first and second metrology structures; measuring alignment error of second level integrated circuit fields from the reference point locations of associated second level third and fourth metrology structures; and measuring overlay error between first level and second level integrated circuit fields from the reference point locations of the first level overlay metrology structures and the reference point locations of the second level metrology structures.

Preferably, determining the locations of common points of reference of the metrology structures comprises first locating edges of each of the structures, and subsequently using the location of the edges to calculate centers of each of the structures.

Each integrated circuit field may have an associated set of metrology structures on a side between an adjacent integrated circuit field on the same level. Printed indicia may be provided adjacent each set of metrology structures to identify the integrated circuit field with which the metrology structure set is associated.

In a preferred embodiment, the fourth structures are smaller than the third structures and in the first level overlay structures are larger than the third structures and, a fourth metrology structure of the second level integrated circuit field is adapted to be contained within a third metrology structure of the second level integrated circuit filed, and a third metrology structure of the second level integrated circuit field is adapted to be contained within a first level overlay metrology structure upon proper alignment of integrated circuit fields in each layer and between layers. The first level metrology structures may comprise separate box structures to determine alignment error within the first level, the second level metrology structures may comprise separate box structures to determine alignment error within the second level, and the first level overlay structure may comprise a box structure larger than the second level box structures.

The common points of reference may comprise centers of the metrology structures. The metrology structures are preferably discernable from each other sufficient to determine their centers. The metrology structures may include edges from which may be calculated centers of each of the structures to determine the common points of reference. Preferably, centers of the metrology structures are the same distance, in the x and y directions, from each side of the fields on each level. The first level metrology structures may include first and second structures on opposite sides of the associated first level integrated circuit field, and the second level metrology structures may include third and fourth structures on opposite sides of the associated second level integrated circuit field. The first level metrology structures may also include first and second structures near opposite ends of a side of the associated first level integrated circuit field, and the second level metrology structures may also include third and fourth structures near opposite ends of a side of the associated second level integrated circuit field.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
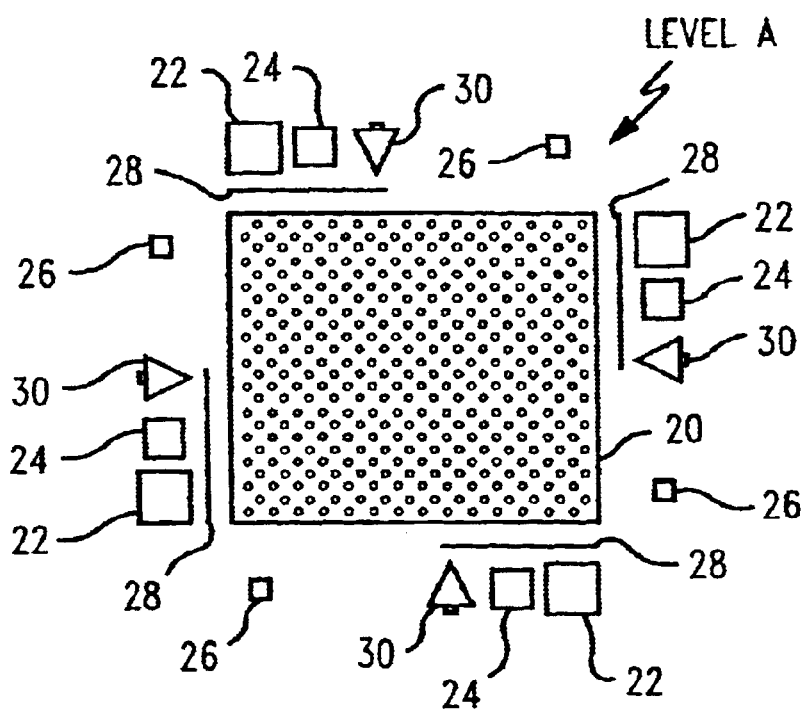
FIG. 1 is a top plan view of an integrated circuit field surrounded by kerf area metrology structures of the present invention lithographically produced on the same layer on a semiconductor wafer.

In describing the preferred embodiment of the present invention, reference will be made herein to FIGS. 1–6 of the drawings in which like numerals refer to like features of the invention. Features of the invention are not necessarily shown to scale in the drawings.

The present invention provides an improvement to the design and layout of the overlay metrology structures needed to determine alignment and overlay error of the integrated circuit fields. Overlay error is generally used to describe layer-to-layer error of superimposed integrated circuit field layers, and overlay targets generally refer to the metrology structures that are used to measure and determine overlay error. On the other hand, butted field targets generally refer to the metrology structures that are used to measure and determine alignment error between fields within a single level. A unique kerf layout for the overlay and butted field metrology structures is described herein which requires no more space in the kerf than what is used in kerfs without the added overlay metrology. The metrology structures of the present invention may be employed with the method for determining and optimizing overlay error correction as described in the aforementioned U.S. Pat. No. 5,877,861, the disclosure of which is hereby incorporated by reference, or by other prior art overlay measurement methods. To accomplish the advanced lithography overlay control described in the referenced patent, two sets of targets are required to be printed in the kerf to determine both intra- and inter-layer alignment. The metrology structure layout of the present invention permits the two targets to be replaced by a single target, while achieving the same overlay measurement goal. Without the layout of the present invention, a full second set of targets requiring additional kerf space would need to be printed.

FIGS. 1–6 described below show preferred embodiments of the kerf area metrology structures of the present invention. Although the metrology structures are shown as box-in-box structures, any other type of metrology structures that are capable of measuring within-level alignment error and level-to-level overlay error may be employed. For the box-in-box structures shown, the term target refers to the larger or outer box or structure and the term bullet refers to the smaller or inner box or structure that has to fit within the target or larger box or structure. Also, as used herein, the term nest refers to one box or structure fitting either within a larger box or structure, or outside of or around a smaller box or structure.

In FIG. 1 there is shown a rectangular integrated circuit field or product cell 20 containing one or more integrated circuit patterns which is made by a lithographic exposure tool or stepper on a first level A. The integrated circuit field 20 is surrounded on each of its four sides by similar sets of associated kerf area metrology structures located adjacent to the side in the kerf area between the integrated circuit field 20 and an adjacent integrated circuit field (not shown). Each associated metrology structure set is printed on the same layer or level as field 20 and includes target 22 comprising a large or outer box 22, an adjacent target comprising an intermediate size box 24, and a bullet comprising a smaller or inner box 26. A straight bar 28 between targets 22, 24 and field 20, and arrow 30 adjacent to target 24 and pointing to field 20, comprise field association indicators or indicia to indicate the field with which the target structures are associated. In place of the arrows and bars shown, any other indicia may be printed adjacent the set of metrology structures to identify the associated integrated circuit field. Target 22 is an overlay target to be used in connection with the overlay error measurement between field 20 on level A, and a superimposed field on a different level B, as will be discussed later. Target 24 and bullet 26 comprise the butted field metrology structures which are provided to measure and determine alignment error between adjacent fields on the same lithographic level A. Targets 24 and bullets 26 are on opposite sides of field 20, as well as near opposite ends of each side of field 20. Targets 24 and bullets 26 are disposed so that their centers are the same distance, in the x and y directions, from each side of field 20. This ensures that they will properly overlap to indicate proper alignment between adjacent fields, i.e., when bullet 26 is aligned within target 24. Bullet 26 should be of a size sufficient to fit within target 24, and the respective edges of the bullet and target may be readily discerned to measure and compare their respective centers and determine any alignment error between the adjacent fields.

Figure 2:
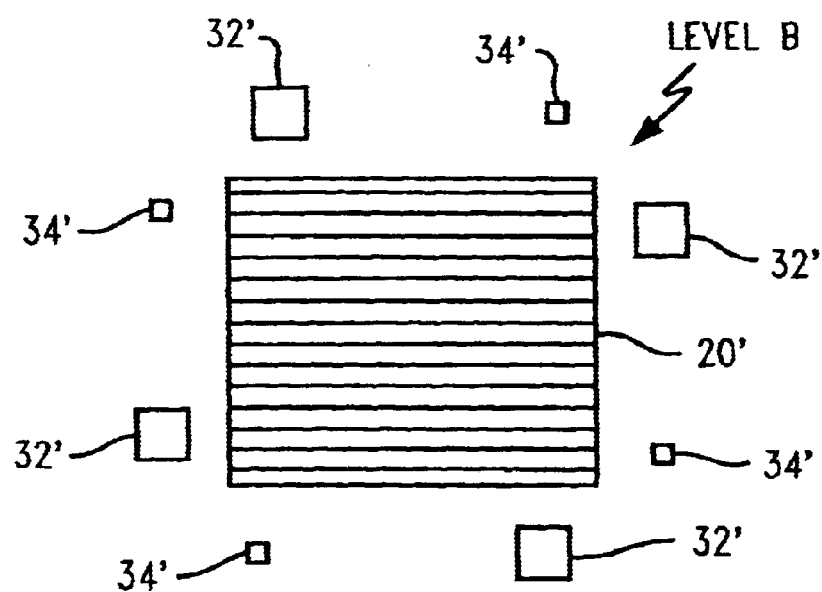
FIG. 2 is a top plan view of an integrated circuit field surrounded by kerf area metrology structures of the present invention lithographically produced on the next layer of the semiconductor wafer of FIG. 1.

The kerf area metrology structures associated with integrated circuit field 20' lithographically produced on next level B are shown in FIG. 2. The metrology structures include a target comprising an intermediate structure 32' and a bullet comprising a smaller, inner structure 34', and are again located alongside each of the four edges of field 20' in the adjacent kerf area. Target 32' and bullet 34' are butted field structures which, when overlapped, determine the alignment of one field 20' from an adjacent integrated circuit field on the same level B. The center of target 32' and the center of bullet 34' are the same distance in the x and y directions from each of the edges of integrated circuit field 20'. Bullet 34' is sized so that it fits within target 32' when the respective fields are properly aligned, so that the edges of each of the target and bullet may be discerned to measure the centers and determine proper alignment between adjacent fields.

Target 32' associated with field 20' on level B also functions as an overlay error bullet, when used in conjunction with overlay target 22 associated with field 20 on level A. For this reason, the center of bullet 32' on level B should be located so that it is coincidence with the center of overlay target 22 when levels and A and B, and fields 20 and 20', are properly aligned with respect to each other. The size of metrology structure 32' should be such that it fits within overlay target 22 so that the edges of each may be discerned to determine the proper alignment of the two.

Figure 3:
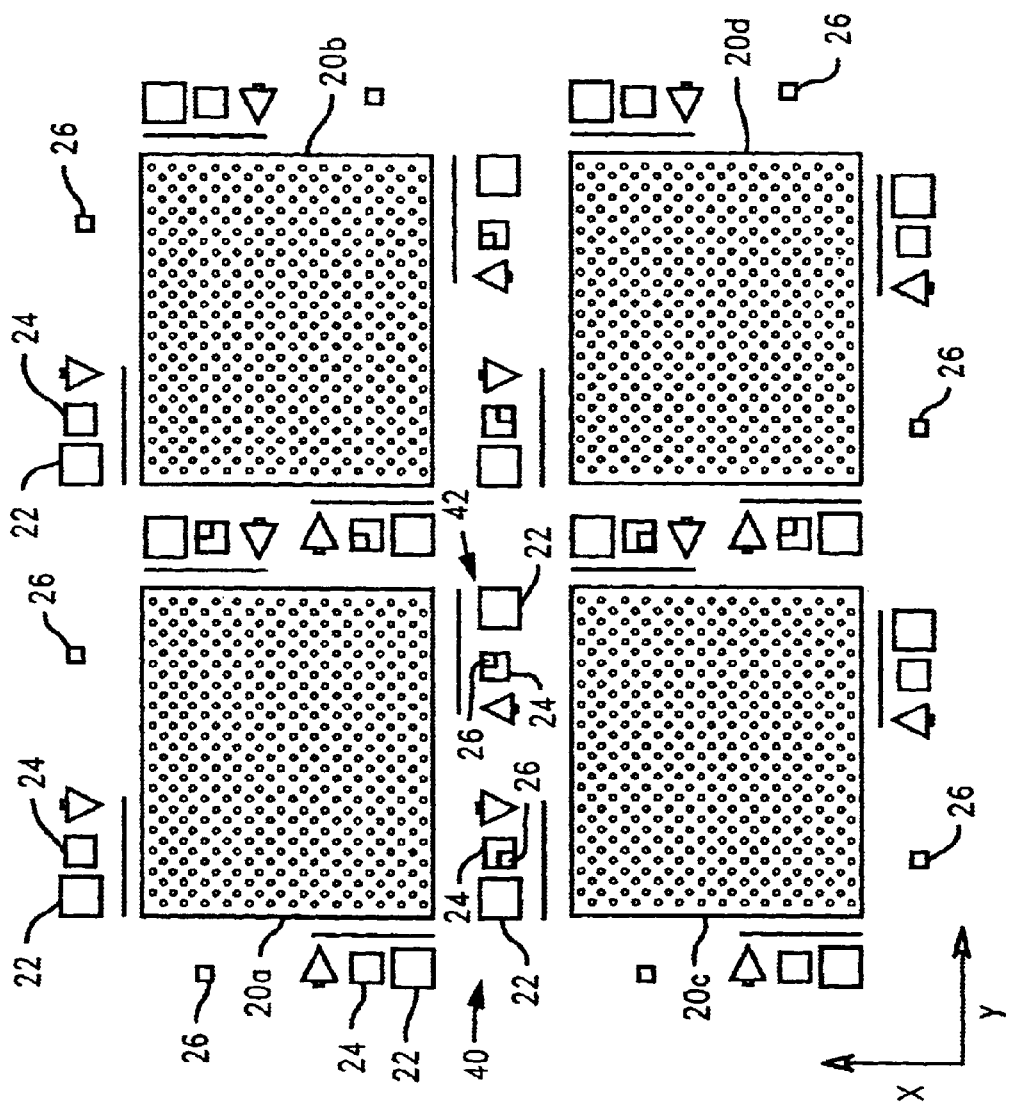
FIG. 3 is a top plan view of a plurality of integrated circuit fields of the type shown in FIG. 1 in a 2×2 matrix, each surrounded by kerf area metrology structures of the present invention lithographically produced on the same layer on a semiconductor wafer.

FIG. 3 depicts the use of the metrology structures of the present invention to determine proper intra-level alignment of fields on the same lithographic process level A. As shown, level A includes four integrated circuit fields 20a, 20b, 20c and 20d in a 2×2 matrix, each having an associated set of metrology structures as described in connection with FIG. 1. The use of these interlocking metrology structures is depicted, for example, in metrology structure sets 40 and 42 between fields 20a and 20c. Metrology structure set 40 comprises target 22 (which is not used for butted field measurements) and target 24, each associated with field 20c, and bullet 26, associated with field 20a, within target 24. Metrology target set 42 comprises overlay target 22 and butted field target 26 associated with field 20a, and bullet 26 associated with field 20c, within target 24. In both target sets 40 and 42, bullets 26 and targets 24 are nested with each other. Similar nested or interlocking target and bullet sets are F shown between fields 20a and 20b, between fields 20b and 20d and between fields 20c and 20d. By determining the respective locations of the centers of bullet 26 and target 24 in each of the metrology sets 40, 42, there can be determined the degree of alignment, and the error which must be corrected, in accordance with prior art methods, including those disclosed in the aforementioned '861 patent.

Figure 4:
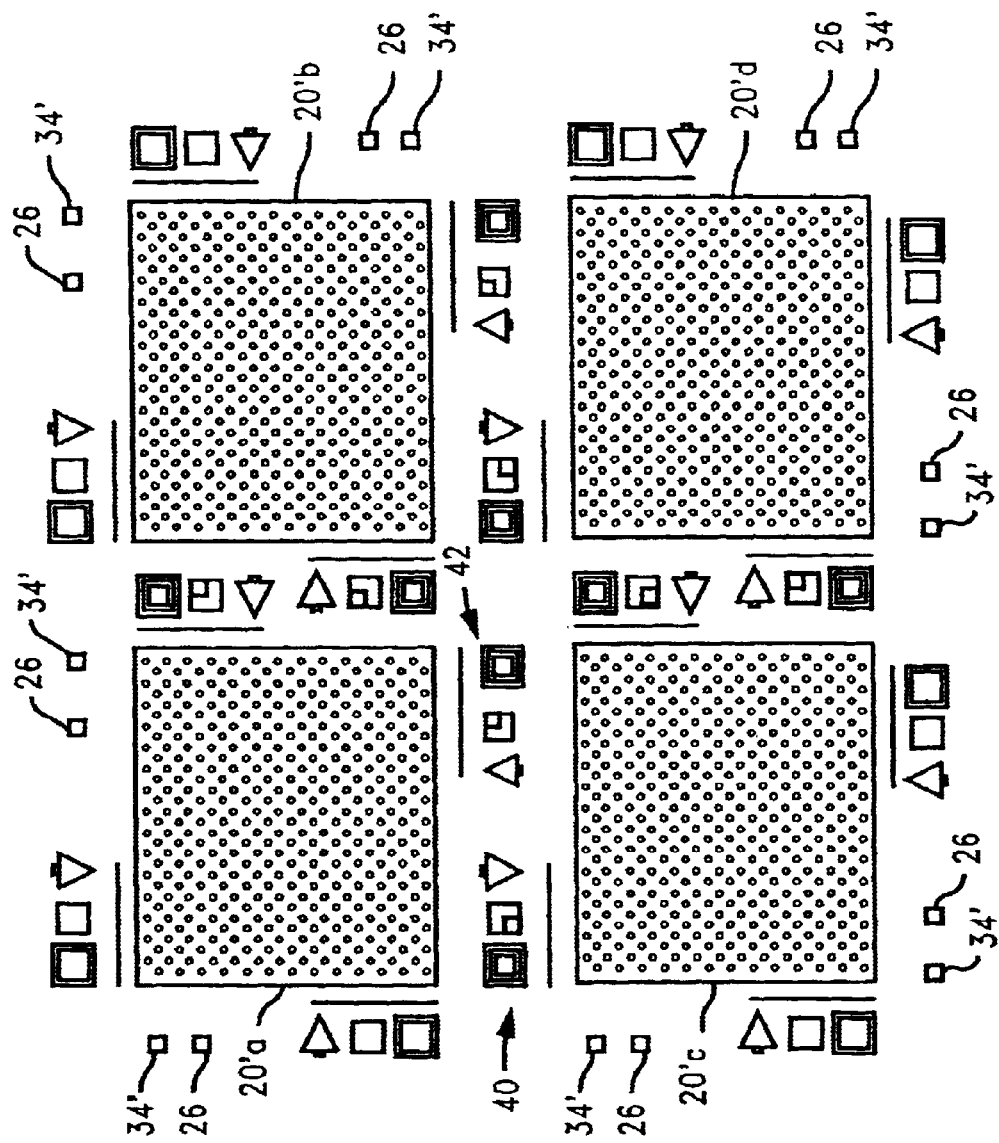
FIG. 4 is a top plan view of a plurality of integrated circuit fields of the type shown in FIG. 2 in a 2×2 matrix overlying the integrated circuit fields of FIG. 3, each surrounded by kerf area metrology structures of the present invention lithographically produced on the same layer on a semiconductor wafer, and also showing the kerf area metrology structures from the previous layer of FIG. 3.

FIG. 4 depicts the use of the metrology structures of the present invention to determine the butted field alignment of field structures 20'a, 20'b, 20'c and 20'd on lithographic level B, as well as the overlay error between these level B field with the corresponding fields on underlying level A. As shown in FIG. 4, and in an enlarged view in FIG. 5, each metrology structure set 40, 42, includes the nested targets and bullets for the fields on level B as described previously in connection with FIG. 2. In metrology structure set 40, target 32', associated with field 20c, contains bullet 34' associated with field 20a. Likewise, metrology structure set 42 contains target 32' associated with field 20'a, and bullet 34' associated with field 20'c. The respective distances between the centers of bullets 32' and targets 34' in each of the nested metrology structure sets 40 and 42 determines the degree of alignment between adjacent fields 20'a and 20'c on level B. FIG. 4 also depicts similar nested metrology structure sets between fields 20'a and 20'b, between fields 20'b and 20'd, and between fields 20'c and 20'd.

Figure 5:
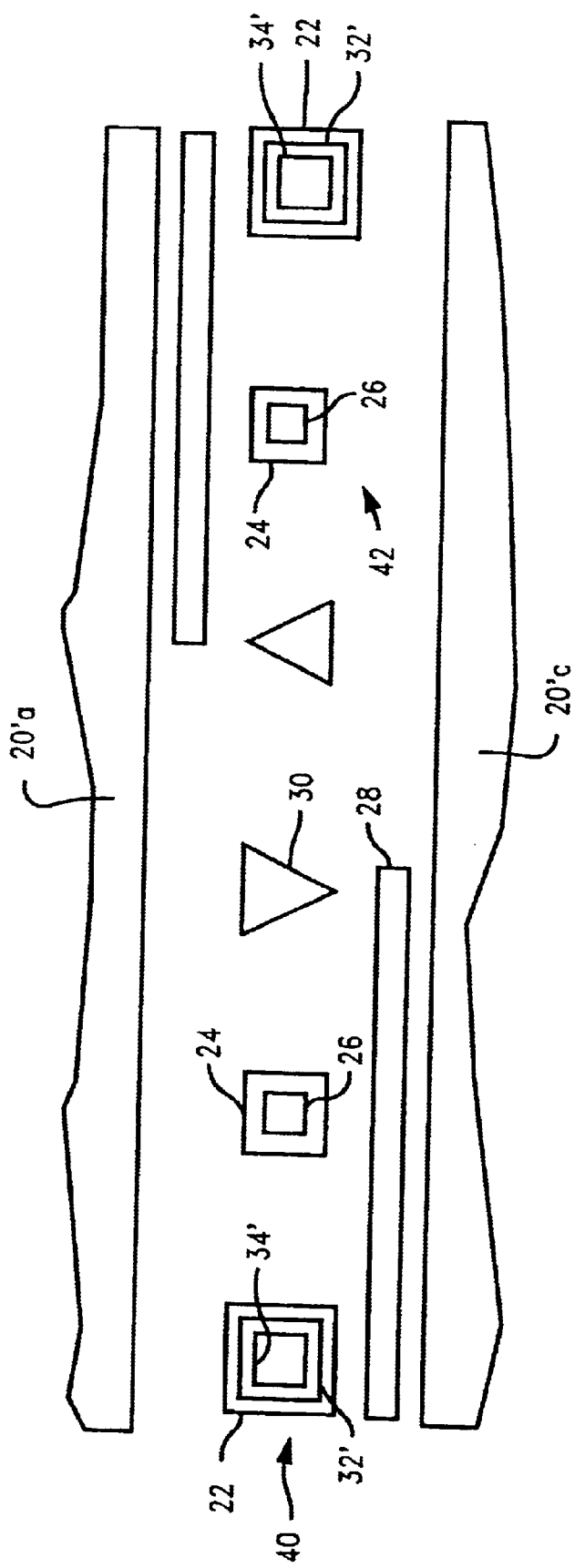
FIG. 5 is a close-up of a portion of FIG. 4, showing the overlying kerf area metrology structures from the layers of FIGS. 3 and 4 between two adjacent integrated circuit fields.

FIGS. 4 and 5 also show the use of the kerf area metrology structures of the present invention to determine overlay error between the fields 20'a, 20'b, 20'c and 20'd on level B, and the corresponding underlying fields 20a, 20b, 20c and 20d, respectively, of level A on which they are superimposed. To measure the overlay error between the respective fields of level A and level B, one measures the distance between the center lines of overlay target 22 associated with level A, and the centers of one or both of target 32' of level B (functioning as a bullet here) or bullet 34' of level B. Again, to determine the overlay error, the methods of the prior art including those of the '861 patent may be employed. Once the alignment overlay errors are determined between fields in the same level and between fields in different levels, the proper correction factors may be applied to the steppers to align their respective fields and levels.

In contrast to the method described in patent '861, the present invention accounts for the contributions of grid and field errors to the within-layer overlay error at alignment layers by modeling the layer-to-layer errors first, i.e., reversing the sequence of steps 88' and 86' shown in FIG. 12 of patent '861. In the preferred embodiment, both grid parameters and the layer-to-layer estimate of field parameters are determined by fitting a stepper specific model to the measured layer-to-layer overlay errors. For a step and scan exposure tool typical equations are of the form:

$$(Xerr_i)_{BA} = XT_{BA} + (GROT_{BA} + GSKEW_{BA})Yi + \\ GXMAG_{BA}X_i + (frot_{BA} + fskew_{BA})y_i + fxmag_{BA}x_i + (Xres_i)_{AB}$$ (1a)

-continued $$(Yerr_i)_{BA} = YT_{BA} - GROT_{BA}X_i + \quad (1b)$$
$$GYMAG_{BA}Y_i - frot_{BA}x_i + fymag_{BA}y_i + (Yres_i)_{AB}$$

(Xi, Yi) are the grid (field-to-field) coordinates and (xi, yi) are the within field coordinates. The "BA" subscript denotes layer-to-layer terms defined as:

Xerri, Yerri: Measured overlay error
XT , YT: X, Y Grid translations
GROT: Grid rotation
GSKEW: Grid skew
GXMAG, GYMAG: Grid magnification
frot: Field rotation
fskew: Field skew
fxmag, fymag: Field magnification
Xresi, Yresi: Residual errors (all non-correctible errors)

The within-layer (subscript "BB") errors are governed by equations of the form:

$$(Xerr_i)_{BB} = 2[(fxmag_{BB} - GXMAG_{BA})x_i + \quad (2a)$$
$$(frot_{BB} - GROT_{BA} + fskew_{BB} - GSKEW_{BA})y_i] + (Xres_i)_{BB}$$

$$(Yerr_i)_{BB} = \quad (2b)$$
$$2[(-frot_{BB} + GROT_{BA})x_i + (fymag_{BB} - GYMAG_{BA})y_i] + (Yres_i)_{BB}$$

where the contributing "BA" grid components are determined by Equation (1). Regardless of where overlay measurement structures are placed in the kerf they must be treated as if they were located at the midpoint of each side of the field (xi=0 on the horizontal sides, or yi=0 on the vertical sides) in solving Equation (2). A unique attribute of this layout is that 2xi and 2yi are equal to the X and Y stepping distance of the fields (the center-to-center field spacings).

The coupled Equations (1) and (2) are solved using a "least squares" best fit or any mathematical technique for solving for the unknown parameters based on minimization of the residual errors. Two approaches to minimization are possible. In the first approach, Equation (1) and (2) are solved sequentially; i.e., the "BA" residuals are minimized independently of the "BB" residuals. In this case, the "BA" field terms are overwritten by the subsequently determined "BB" field terms; i.e., the field terms are determined solely by the within-layer overlay errors. In the second approach, the average or weighted average of the "BA" and "BB" residuals is minimized. In this case, the field terms are an average or weighted average between the layer-to-layer and within-layer terms.

In a typical wafer, there would be many product levels, and the kerf measurement structures may continue through the entire chain of levels, so that there may be 20, 30 or more structures in the kerf area to measure the alignment in and between the different layers.

Figure 6:
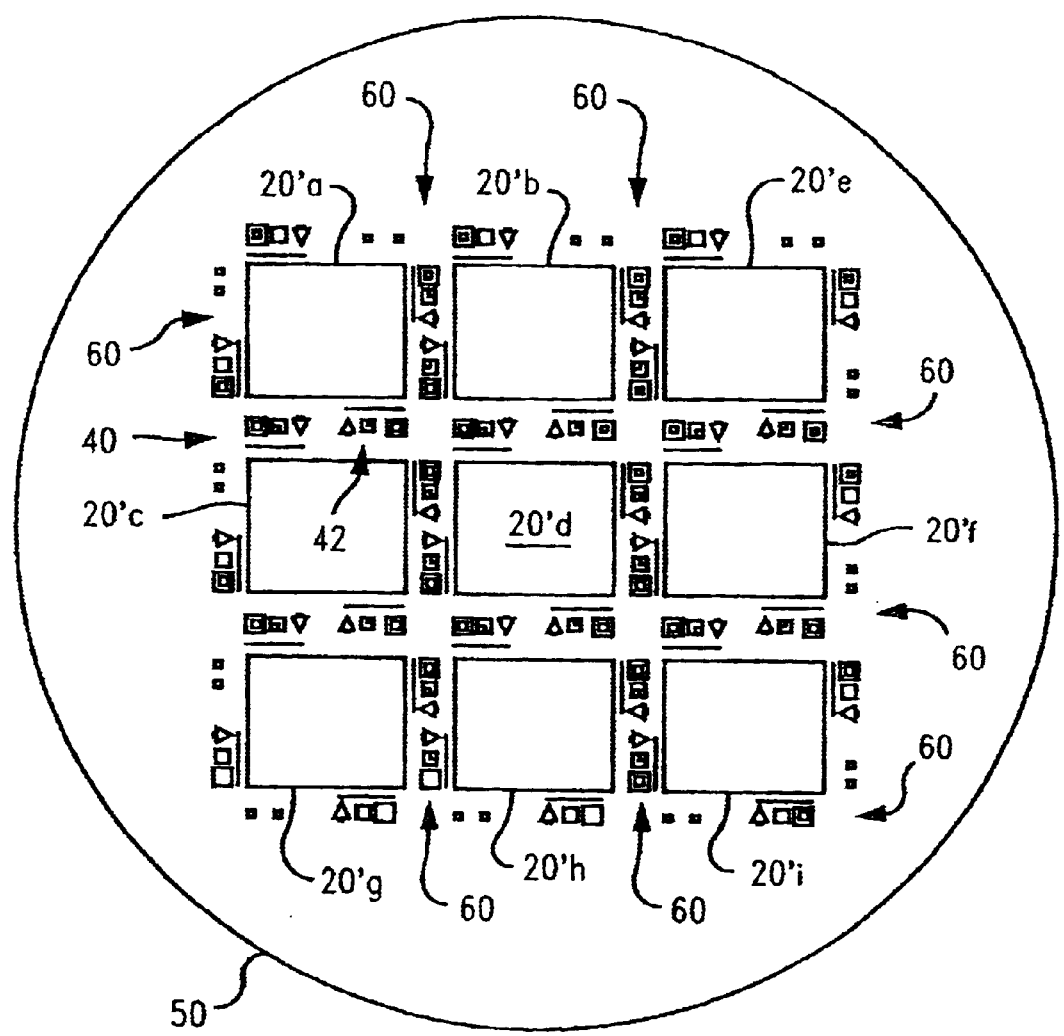
FIG. 6 is a top plan view of a semiconductor wafer showing a 3×3 matrix of overlying integrated circuit fields and kerf area metrology structures of the present invention.

FIG. 6 depicts an integrated circuit wafer 50 in which are lithographically printed on level B, integrated circuit fields 20'a through 20'i and in the kerf area 60 between each field, metrology structures 40, 42 as described previously. As can be seen, the metrology structures of the present invention utilize the wafer kerf area efficiently to minimize space that must be devoted to the metrology target and maximize the space that may be devoted to the integrated circuit fields or product cells. These fields or product cells are eventually cut along the kerf areas to form separate integrated circuit chips.

In practicing the present invention to determine alignment and overlay error, one generally measures the position of the bullet with respect to the target. It is not necessary that outer, intermediate and inner measurement structures be located on the respective levels in the precise manner described herein. For example, target or outer box 22 on level A, used to determine inter-level overlay error, may be replaced by a bullet or inner box, and intermediate boxes 32' and inner boxes 34' on level B may be replaced by larger boxes, so long as they are all of different size so that their respective edges can be discerned to determine the respective centers of each. An advantage of the present invention is that it enables measurement efficiency because one can measure alignment overlay errors between fields in the same level and between fields in different levels in a single measurement on a single interlocked measurement structure set, as opposed to taking two separate measurements. The method and system of the present invention enables one to determine overlay error without reducing the amount of active circuit area on a semiconductor wafer.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of determining alignment error between lithographically produced integrated circuit fields on the same and different lithographic levels comprising:

creating a first level field layer having a plurality of first level integrated circuit fields and associated set of first level metrology structures adjacent and outside each integrated circuit field, the first level metrology structures including separate first and second structures, a second structure associated with one first level integrated circuit field being located to nest with a first structure associated with an adjacent, first level integrated circuit field when the both first level integrated circuit fields are properly aligned on the same lithographic level, the first level metrology structures further including overlay metrology structures to determine overlay error between the first level field layer and a field layer on another level;

creating a second level field layer having a plurality of second level integrated circuit fields and associated set of second level metrology structures adjacent and outside each integrated circuit field, the second level metrology structures including separate third and fourth structures, a fourth structure associated with one second level integrated circuit field being located to nest with a third structure associated with an adjacent, second level integrated circuit field when the both second level integrated circuit fields are properly aligned on the same lithographic level, and a second level metrology structure of one second level integrated circuit field being located to nest with an overlay metrology structure of the first level integrated circuit field when the first and second level integrated circuit fields are properly aligned on different lithographic levels;

determining the locations of common points of reference on the associated first level metrology structures and on the associated second level metrology structures;

measuring alignment error of first level integrated circuit fields from the reference point locations of associated first level first and second metrology structures;

measuring alignment error of second level integrated circuit fields from the reference point locations of associated second level third and fourth metrology structures; and measuring overlay error between first level and second level integrated circuit fields from the reference point locations of the first level overlay metrology structures and the reference point locations of the second level metrology structures.

2. The method of claim 1 wherein each integrated circuit field has an associated set of metrology structures on a side between an adjacent integrated circuit field on the same level.

3. The method of claim 1 wherein the fourth structures are smaller than the third structures and in the first level overlay structures are larger than the third structures and, upon proper alignment of integrated circuit fields in each layer and between layers, a fourth metrology structure of the second level integrated circuit field is contained within a third metrology structure of the second level integrated circuit field, and a third metrology structure of the second level integrated circuit field is contained within a first level overlay metrology structure.

4. The method of claim 1 further including printing indicia adjacent each set of metrology structures to identify the integrated circuit field with which the metrology structure set is associated.

5. The method of claim 1 wherein the first level metrology structures comprise separate box structures to determine alignment error within the first level, the second level metrology structures comprise separate box structures to determine alignment error within the second level, and the first level overlay structure comprises a box structure larger than the second level box structures.

6. The method of claim 1 wherein centers of the metrology structures are the same distance, in the x and y directions, from each side of the fields on each level.

7. The method of claim 1 wherein determining the locations of common points of reference of the metrology structures comprises first locating edges of each of the structures, and subsequently using the location of the edges to calculate centers of each of the structures.

8. The method of claim 1 wherein the first level metrology structures include first and second structures on opposite sides of the associated first level integrated circuit field, and the second level metrology structures include third and fourth structures on opposite sides of the associated second level integrated circuit field.

9. The method of claim 1 wherein the first level metrology structures include first and second structures near opposite ends of a side of the associated first level integrated circuit field, and the second level metrology structures include third and fourth structures near opposite ends of a side of the associated second level integrated circuit field.

10. The method of claim 1 wherein the common points of reference comprise centers of the metrology structures, and wherein the metrology structures may be discerned from each other sufficient to determine their centers.

11. A system for determining alignment error between lithographically produced integrated circuit fields on the same and different lithographic levels comprising:

a first level field layer having a plurality of first level integrated circuit fields and associated set of first level metrology structures adjacent and outside each integrated circuit field, the first level metrology structures including separate first and second structures, a second structure associated with one first level integrated circuit field being located to nest with a first structure associated with an adjacent, first level integrated circuit field when the both first level integrated circuit fields are properly aligned on the same lithographic level, the first level metrology structures further including overlay metrology structures to determine overlay error between the first level field layer and a field layer on another level; and a second level field layer having a plurality of second level integrated circuit fields and associated set of second level metrology structures adjacent and outside each integrated circuit field, the second level metrology structures including separate third and fourth structures, a fourth structure associated with one second level integrated circuit field being located to nest with a third structure associated with an adjacent, second level integrated circuit field when the both second level integrated circuit fields are properly aligned on the same lithographic level, and a second level metrology structure of one second level integrated circuit field being located to nest with an overlay metrology structure of the first level integrated circuit field when the first and second level integrated circuit fields are properly aligned on different lithographic levels, wherein alignment error of the first level integrated circuit fields may be determined from common reference point locations of associated first level first and second metrology structures, alignment error of the second level integrated circuit fields may be determined from common reference point locations of associated second level third and fourth metrology structures, and overlay error between first level and second level integrated circuit fields may be determined from common reference point locations of a first level overlay metrology structures and common reference point locations of a second level metrology structure.

12. The system of claim 11 wherein each integrated circuit field has an associated set of metrology structures on a side between an adjacent integrated circuit field on the same level.

13. The system of claim 11 wherein the fourth structures are smaller than the third structures and in the first level overlay structures are larger than the third structures and, a fourth metrology structure of the second level integrated circuit field is adapted to be contained within a third metrology structure of the second level integrated circuit field, and a third metrology structure of the second level integrated circuit field is adapted to be contained within a first level overlay metrology structure upon proper alignment of integrated circuit fields in each layer and between layers.

14. The system of claim 11 further including printed indicia adjacent each set of metrology structures identifying the integrated circuit field with which the metrology structure set is associated.

15. The system of claim 11 wherein the first level metrology structures comprise separate box structures to determine alignment error within the first level, the second level metrology structures comprise separate box structures to determine alignment error within the second level, and the first level overlay structure comprises a box structure larger than the second level box structures.

16. The system of claim 11 wherein centers of the metrology structures are the same distance, in the x and y directions, from each side of the fields on each level.

17. The system of claim 11 wherein the metrology structures include edges from which may be calculated centers of each of the structures to determine the common points of reference.

18. The system of claim 11 wherein the first level metrology structures include first and second structures on opposite sides of the associated first level integrated circuit field, and the second level metrology structures include third and fourth structures on opposite sides of the associated second level integrated circuit field.

19. The system of claim 11 wherein the first level metrology structures include first and second structures near opposite ends of a side of the associated first level integrated circuit field, and the second level metrology structures include third and fourth structures near opposite ends of a side of the associated second level integrated circuit field.

20. The system of claim 11 wherein the common points of reference comprise centers of the metrology structures, and wherein the metrology structures are adapted to be discerned from each other sufficient to determine their centers.

* * * * *